United States Patent
Eizadkhah et al.

(12)

(10) Patent No.: US 6,193,341 B1
(45) Date of Patent: Feb. 27, 2001

(54) TILTABLE ELECTRONICS CABINET

(75) Inventors: Denise Eizadkhah, Bridgewater, NJ (US); Steven D. Handwerk, East Stroudsburg, PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/575,066

(22) Filed: May 19, 2000

Related U.S. Application Data

(62) Division of application No. 09/087,360, filed on May 29, 1998, now Pat. No. 6,082,865.

(51) Int. Cl.⁷ .................................................. A47B 88/00
(52) U.S. Cl. ...................... 312/323; 312/223.1; 361/727
(58) Field of Search .............................. 312/223.1, 223.2, 312/349, 333, 338.1, 322, 323, 308; 361/829, 725, 726, 727, 330

(56) References Cited

U.S. PATENT DOCUMENTS

| | | | |
|---|---|---|---|
| 2,717,188 | * 9/1955 | Kuss | 361/727 |
| 2,857,558 | * 10/1958 | Fiske | 361/727 |
| 3,710,199 | * 1/1973 | Cignoni et al. | 312/223.1 |
| 5,460,441 | * 10/1995 | Hastings et al. | 312/298 |
| 5,584,396 | * 12/1996 | Schmitt | 361/727 |

FOREIGN PATENT DOCUMENTS

| | | |
|---|---|---|
| 498073 | 8/1992 | (EP) . |
| 2072954 | 10/1981 | (GB) . |

* cited by examiner

*Primary Examiner*—Peter M. Cuomo
*Assistant Examiner*—Jerry A. Anderson
(74) *Attorney, Agent, or Firm*—Synnestvedt & Lechner LLP

(57) ABSTRACT

An electronics cabinet assembly having a support shelf and an equipment module movably supported thereon. The equipment module is moveable between a closed position adjacent the rear of the support shelf, and an extended position substantially forward relative of the support shelf where the equipment module is hingably supported on the support shelf such that the front of the equipment module can tilt downwards to expose the rear of the equipment module for easy access to the wire and cable connectors.

18 Claims, 5 Drawing Sheets

TILTABLE ELECTRONICS CABINET

RELATED APPLICATIONS

This application is a divisional of U.S. application Ser. No. 09/087,360, filed May 29, 1998 now U.S. Pat. No. 6,082,865.

BACKGROUND OF THE INVENTION

The present invention relates to cabinets for the installation of electronics equipment including telecommunications equipment, and more particularly, to cabinets that provide access to the equipment within.

Particular types of electronics and telecommunications installations require various components connected together with a myriad of wires and cables. For example, certain telecommunications installations for telephone customers receive a fiber optic bundle from the local telephone company. To connect to the customer's phone lines, equipment is needed to convert the wide band optical signals to narrow band digital signals, and other equipment is needed to convert the narrow band digital signals to analog. A rectifier is required to convert the power from local 120 volt outlets, and back up batteries are needed in case the local power source fails.

Typically, the various equipment components are installed on stationary racks and/or shelves. Installing the equipment on racks or shelves near or mounted on the wall can be problematic as access to the wire and cable connectors on the rear of the equipment is difficult if not impossible.

Moreover, present shelf and rack systems are not easily integrated with the power supply and batteries. Major improvements over present installations are necessary to provide simpler, less costly, and easier to maintain installations.

Accordingly it is an object of the present invention to provide an electronics cabinet assembly that can integrate the electronics equipment and power supply.

Another object is to provide an electronics cabinet assembly that is easy to install.

A further object is provide an electronics cabinet assembly that can be mounted on the wall or on a pedestal.

A still further object is to provide an electronics cabinet assembly that provides access to the wire and cable connections in the rear of the equipment.

Another object is to provide an electronics cabinet that can be stacked on top of other cabinets and equipment and still provide access to the rear of the equipment.

Additional objects, advantages and novel features of the invention will be set forth in part in the description that follows, and in part will become apparent to those of ordinary skill in the art upon review of the following or may be learned by practice of the invention.

SUMMARY OF THE INVENTION

In broad terms, the objects and advantages of the present invention can be attained by providing an electronics cabinet assembly having a support shelf and an equipment module which is movably supported on the support shelf. The equipment, module, having a front and a rear, is moveable between a closed position adjacent the rear of the support shelf, and an extended position in which it is substantially forward relative to the support shelf. When the equipment module is in the extended position, it is hingably supported on the support shelf to be tiltable about a pivot axis such that the front of the equipment module can tilt downwards to expose the rear of the equipment housed within.

Whether wall or pedestal mounted, the cabinet assembly provides for simplified installation of the equipment module. The support shelf is typically installed or mounted first without the heavier equipment module. The equipment module is then placed onto the pre-installed support shelf and attached thereto. Access to the rear of the equipment module for making the wire and cable connections is readily provided: the equipment is moved forward to its extended position where the front of the equipment module tilts downward to expose the rear. The cabinet assembly can be stacked and bundled with other equipment or other such cabinet assemblies. Access to the connectors for installation and wiring is again provided simply by moving the particular cabinet assembly forward to clear the other equipment where it tilts downward to expose the rear.

The support shelf preferably includes a track on which the equipment module is movably supported. When in the closed position, the equipment module is at least substantially supported on the track. When in the extended position, the equipment module is substantially forward relative to the support shelf and substantially off of the track where it is hingably supported by the support shelf for tilting.

The cabinet assembly can include a wire and cable trough between the rear of the equipment module and the support shelf for the wires and cables. In this manner, the cabinet assembly can be attached directly to a wall as the trough for the wires and cables is within the cabinet assembly. Whether wall or pedestal mounted, the cabinet assembly provides a secured, efficient housing for the equipment and wires and cables.

DETAILED DESCRIPTION OF THE DRAWINGS

DETAILED DESCRIPTION

Illustrated in FIGS. 1–6 is a preferred embodiment of the present invention for use as a Secured-area, Telecommunications Application Cabinet (STAC). This is an electronics cabinet assembly for housing telecommunications equipment in an indoor restricted access area. This particular cabinet is shown mounted on a pedestal housing batteries, but can also be wall-mounted as further described below.

Figure 1:
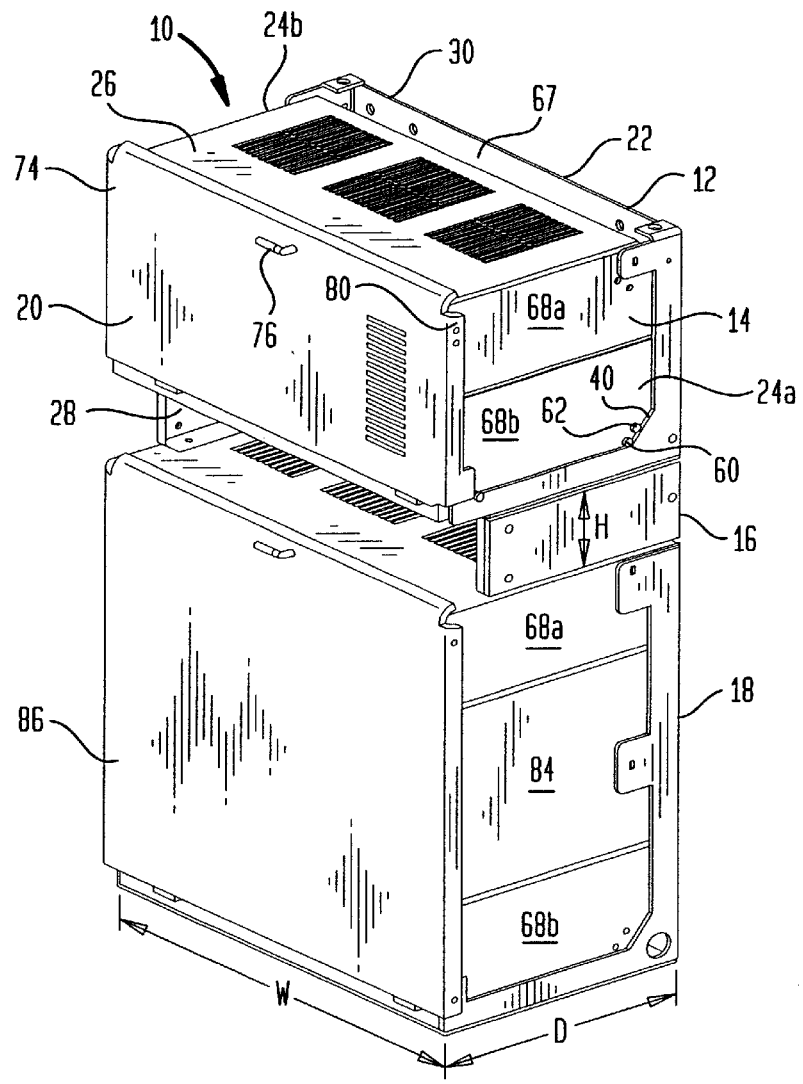
FIG. 1 is a perspective view of a cabinet assembly of the present invention mounted on a pedestal and shown in the closed position.
Figure 2:
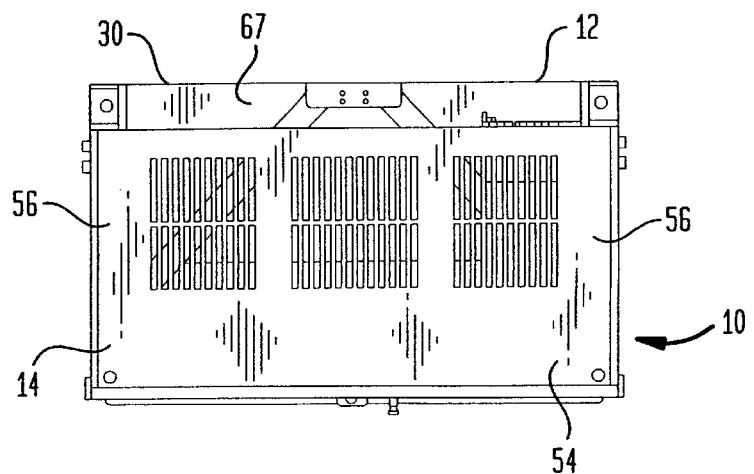
FIG. 2 is a top view of the cabinet assembly shown in FIG. 1.
Figure 3:
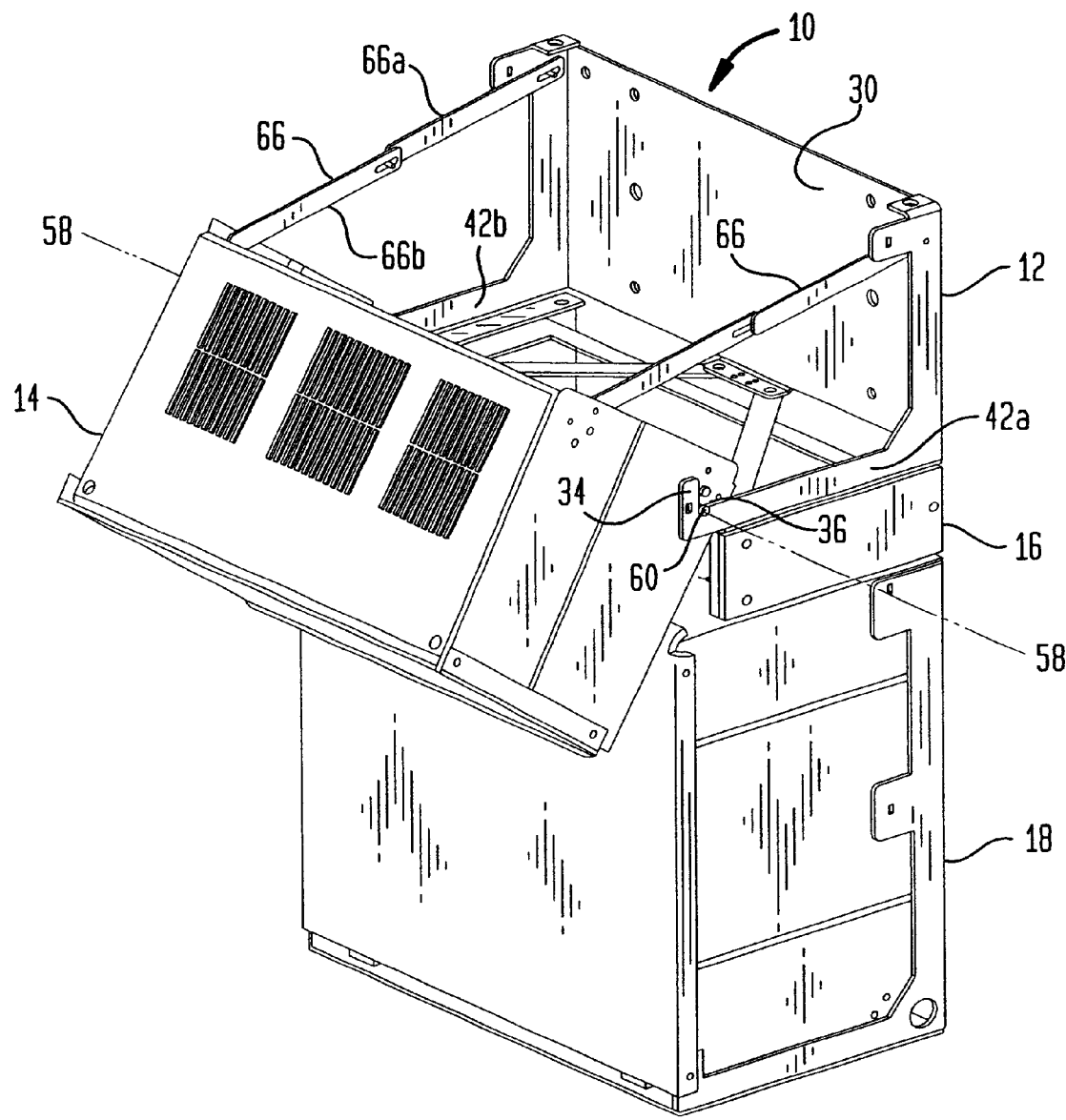
FIG. 3 is a perspective view of the cabinet assembly of FIG. 1 shown in its extended and tilted position.
Figure 4:
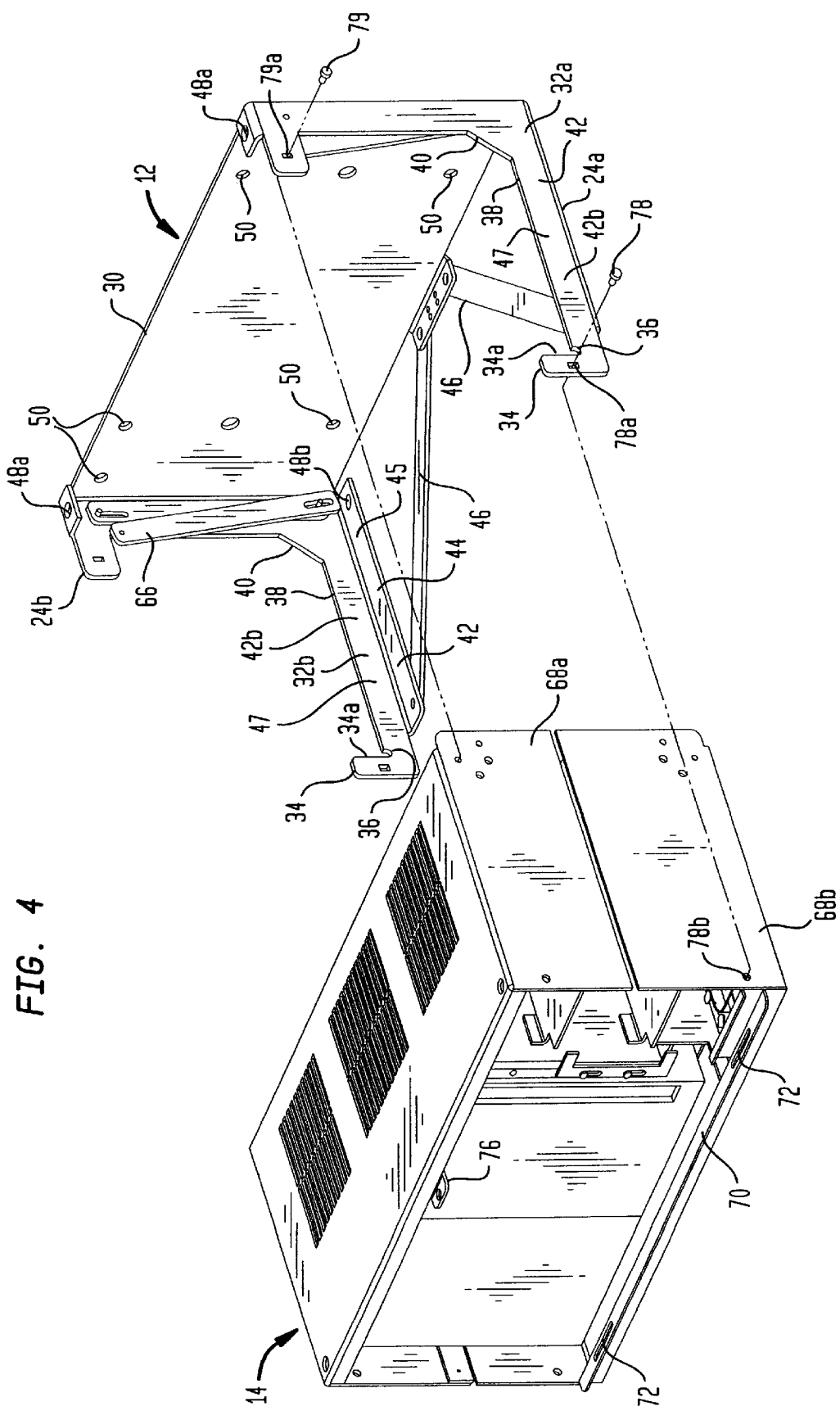
FIG. 4 is an exploded perspective view of the cabinet assembly of FIG. 1 showing the equipment module separated from the support shelf and showing mounting structures within the equipment module.

With particular reference to FIGS. 1, 2 and 4, the electronics cabinet assembly 10 of the present invention includes a support shelf 12 and an equipment module 14 supported on the shelf 12. The cabinet assembly 10 is fixedly mounted on top of a spacer 16, which in turn is fixedly mounted on top of a pedestal battery module 18 anchored to the floor by means such as bolts. The various components are fixed together and to the floor as described to prevent the electronics cabinet assembly 10 from tipping over when the equipment module 12 is tilted (FIG. 3) as further described below.

The cabinet assembly 10 is now described in detail beginning with the support shelf 12. For orientation and reference purposes, the cabinet assembly 10 has a front 20, rear 22, sides 24a, 24b, top 26 and bottom 28 as indicated in FIG. 1.

With reference to FIG. 4, the support shelf 12 has a planar rear panel 30, and a pair of arms 32a, 32b, extending forward from the panel 30 along opposite sides 24a, 24b. Extending upwardly from a forward end of each arm 32a, 32b is a projection device 34 such as the flat finger 34 having an inner vertical edge 34a. A semi-circular notch 36 is formed at the intersection of the vertical edge 34a and a top edge 38 of the arms 32a, 32b as shown. The rear end of the arms 32a, 32b form an angled shoulder 40 as shown.

The shelf 12 includes at least one track 42 for supporting the equipment module 14 and upon which the equipment module 14 can move. In the illustrated embodiment, the track 42 takes the form of two tracks 42a, 42b, each extending forward from the rear of the shelf 12, and each having a horizontal lower brace 44 and a vertical rail 47, both of which are integrally formed on the arms 32a, 32b as shown. The top edge 38 forms the top of the vertical rails 47. The top surface 45 of the braces 44 and the top edge 38 of the rails 47 form a flat, smooth surface on which the equipment module 14 can slide as further discussed below.

Structural rigidity and strength are added to the shelf 12 by struts 46 fixed at one end to the tracks 42a, 42b and at the other end to the rear panel 30 along the bottom of the support shelf 12. The struts 46 are fixed as described by any suitable means such as rivets, welding, etc. Bolt holes 48a, 48b on the top and bottom of the shelf 12 are provided for securing the container assembly 10 to the spacer 16 as shown or any other component which may be attached on top or below. While the cabinet assembly 10 illustrated is pedestal mounted, it may also be mounted on a wall. A suitable number (6) of bolt holes 50 are provided in the rear panel 30 for wall mounting.

The equipment module 14 houses the telecommunication and electronics equipment and is supported on the shelf 12 to be moveable between a closed, upright position as seen in FIG. 1 where it is substantially supported on the track 42, and an extended position forward of the closed position relative to the shelf 12 as seen in FIG. 3 where it is substantially off the track 42 allowing the front of the equipment module 14 to tilt downward to provide access to its rear. Electronic equipment is mounted within the equipment module 14 such that the front of the equipment faces forward 20 and the back of the equipment, having the wire and cable connectors, face rearward 22.

Figure 5:
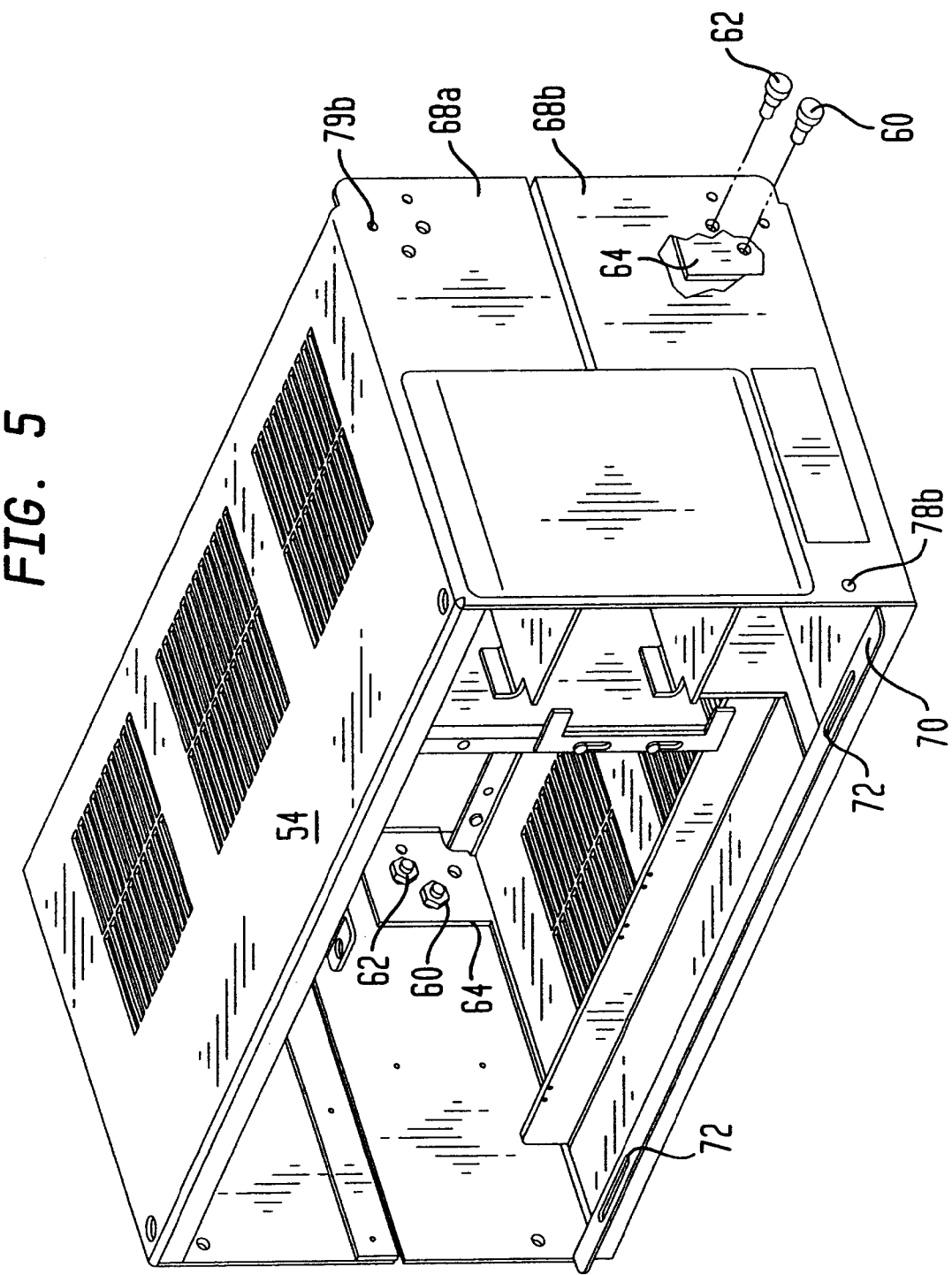
FIG. 5 is an enlarge perspective view of the equipment module.

The bottom of the equipment module 14 (not shown), identical to the top 54 in the present embodiment, is formed of sheet metal, preferably aluminum, and has flat, smooth side ends 56 (illustrated for the top 54 in FIG. 1) which are movably supported on the tracks 42 for sliding movement between the closed and extended position. Small wheels, ball rollers, or any type of sliding mechanism such as those used with drawers, could be used to aid movement of the equipment module 14 over the track 42, but are unnecessary for the present embodiment. The equipment module 16 is also movably supported on the top edges 38 of the rails 47 by pins 60 fixed to and extending from opposite sides of the equipment module 14 as seen in FIGS. 1 and 5. In the illustrated form, the pin 60 takes the form of a shoulder screw as further described below, but may comprise any suitable structure for slidably sitting upon the rails 47, and can also include rollers and wheels. Although the equipment module of the present embodiment is movably supported on the braces 44 and the vertical rails 47 on each track 42a, 42b, it is recognized that the equipment module 14 could be movably supported on either one alone with suitable modification to the device. For example, raising slightly the pins 60 would place full moveable support on the braces 44, while lowering slightly the pins 60 would place support of the rear of the equipment module 14 on the pins 60, the front of the equipment module 14 (or that part of the module still over the forward section of the braces as the equipment module is moved) being supported on the braces 44.

As seen in FIG. 3, the equipment module 14 is supported hingably on the support shelf 12 for rotation (tilting) about a pivot axis 58 when in the extended position to enable the front of the module 14 to tilt downward relative to the shelf.

In the illustrated embodiment, the hinged support at the pivot axis 58 is provided by the pair of pins 60 (hinge pins) extending from both sides of the module 14 as previously described above. The pins 60 move downward to engage the support shelf 12 in the notches 36 when the equipment module 14 is fully extended and tilted downward (see FIG. 5). The equipment module 14 can be slid forward to a position where the pins 60 hit the fingers 34. No longer substantially supported on the tracks 42a 42b, the front of the equipment module 14 can tilt downward, engaging the pins 60 in the notches 36 to hold the pins 60 in place.

To hold the equipment module 14 in its fully tilted position, a second pair of pins 62 (stop pins) extend from both sides of the equipment module 14 slightly above and to the rear of the hinge pins 60 as best seen in FIGS. 5 and 3. With the hinge pins 60 engaged in and held by the notches 36, the stop pins 62 engage the edge 34a of the finger 34 to prevent further tilting and thereby hold the equipment module 14 in its tilted position. With reference to FIG. 1, it is seen that the stop pins 62 also function to define the closed position of the equipment module 14 relative to the support shelf 12 by engaging the shoulder 40 to prevent any further movement rearward.

The first (hinge) pins 60 and second (stop) pins 62 are formed from any suitable extension member, shoulder screws being used in the illustrated embodiment which is compatible with the use of pins 60 for also movably supporting the equipment module 14 on the rails 47. As seen in FIG. 5, the shoulder screw pins 60, 62 are fixed to the side panels of the equipment module 14 with nuts and a reinforcing plate 64 positioned on the inside of the equipment module 14. The pins 60, 62 are positioned far enough back on the equipment module 14 so that the equipment module 14 clears the track 42 when tilting. Moreover, the hinge pins 60 are rearward of the center of gravity of the equipment module 14 so that the equipment module can 14 tilt downward on its own once moved into the extended position, although the person moving the equipment module 14 should lower it gently.

A secondary means for holding the equipment module 14 in the tilted position is provided by a pair of stop arms 66 as seen in FIGS. 3 and 4. Each stop arm 66 is preferably formed of two arm sections 66a, 66b pivotally attached to one another to fold as seen in FIG. 5. One end of each stop arm 66 is pivotally attached to the equipment module 14, the other end to the support shelf 12. When fully extended, as seen in FIG. 5, the equipment module 14 can tilt no further.

The arms 66 thereby provide an additional (safety) stop in addition to the stop pins 62, or could be used as an alternative stop in place of the stop pins 62.

With reference to FIGS. 1 and 2, a trough 67 for wires and cables is provided between the rear of the equipment module 14 and rear of the panel 30 of the support shelf 12. The trough 67 runs the entire height and width of the cabinet assembly 10 to provide room for the wires and cables coming from above and below for connection to the equipment in the equipment module 14 as well as any wires and cables running through the trough 67 to equipment above or below the cabinet assembly 10. The stop pins 62 engage the shoulder 40 of the support shelf 12 to prevent the equipment module 14 from any further movement rearward and thus defines the closed position of the cabinet assembly 10 while providing the desired trough depth.

The support shelf 12 and the equipment module 14 are preferably formed of sheet metal, such as aluminum, having a thickness or gauge suitable for the weight to be supported. The support shelf 12 is preferably formed of a single piece of aluminum sheet, the struts 46 being riveted thereto.

The equipment module 14 is preferably formed of two identical half sections 68a, 68b (one section turned upside down relative to the other) riveted together to form the box-like module 14 (FIG. 1). A bottom lip 70 having slots 72 (FIG. 5) is riveted to the bottom section 68b for supporting a door 74 (FIG. 1). The two half sections 68a, 68b each have air vents as shown for heat dissipation, and have internal structures added to facilitate mounting of the electronics and telecommunications equipment housed within as seen in FIG. 4.

The door 74 has an opening for engaging a lock bracket 76 riveted to the top shelf section 68a. The lock bracket 76 has a hole for receiving a padlock to lock the door 74 in place. Unauthorized movement and tilting of the equipment module 14 is prevented by placing a pin 78 through an opening 78a in the finger 34 and into a corresponding opening 78b in the equipment module 14 when it is in the closed position. The door 74, as seen in FIG. 1, has side edges 80 to cover the pins 78 and thereby prevent their removal when the door 74 is locked in place. A pin 79 can also be placed through the support shelf opening 79a and equipment module opening 79b to further secure the equipment module 14.

The cabinet assembly 10 is preferably painted. However, the stop arms 66, also made of aluminum, are not painted to ensure a ground connection between the shelf 12 and the equipment module 14.

The cabinet assembly 10 of the illustrated embodiment is ideally suited for pedestal mounting as illustrated, as well as for wall mounting. As seen in FIGS. 1, 2 and 3, the cabinet assembly 10 is mounted on top of the battery-containing pedestal 18 which provides back-up power for the telecommunications equipment module 14. The battery module 18 is formed to have a similar width (W) and depth (D) as the cabinet assembly 10.

Figure 6:
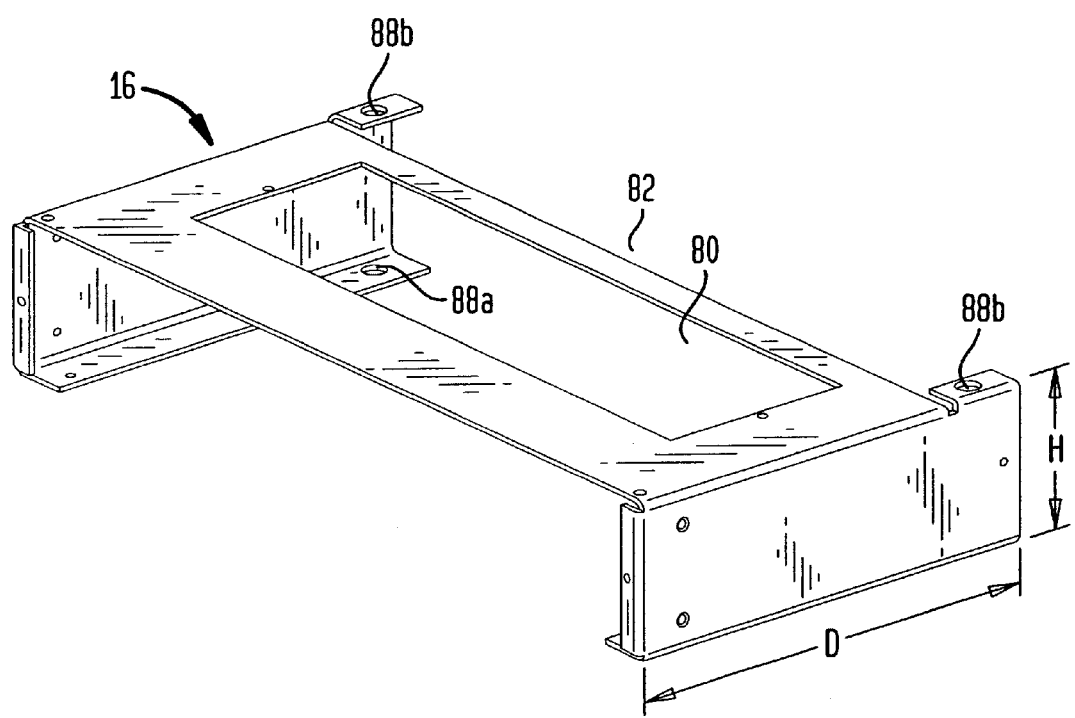
FIG. 6 is a perspective view of the spacer on which the cabinet assembly is mounted in FIG. 1.

The spacer 16 between the cabinet assembly 10 and the pedestal 18 is sized to provide sufficient height (H) and clearance so that the equipment module 14 can tilt forward without interference from the front top edge of the battery module 18, while being lesser in depth (D) so that it itself does not interfere with the tilting of equipment module 14. With reference to FIG. 6, the spacer 16 is likewise formed from aluminum sheet and has a large, rectangular top opening 80 to allow air flow into the vents in the bottom 68b of the equipment module 14. A trough 82 running the width and height of the spacer 16 and which aligns with the trough 67 is provided in the support shelf 12 for the wires and cables. It is contemplated that baffles and/or fans to direct air flow could be added within the spacer 16 to improve air flow as necessary.

The pedestal cabinet 18, housing the batteries, is of similar width and depth as the cabinet assembly 10, and should be anchored to the floor or wall to prevent tipping. It is likewise formed of aluminum sheet and includes similar top and bottom sections 68a, 68b as the cabinet assembly 10. An extension section 84 riveted in between the two section 68a, 68b, provides the additional height. A door 86 connects and locks to the front of the pedestal 18 in a similar manner as the door 74 of the equipment module 14. A pedestal trough (not shown) running the height of the pedestal 18 aligns with the spacer trough 82 and cabinet assembly trough 67 to provide a trough for wires and cables running the full height of the pedestal 18, spacer 16, and cabinet assembly 10 when connected together to form a single unit.

The spacer 16 is bolted to the top of the pedestal at bolt holes 88a. The cabinet assembly 10 is bolted to the spacer through bolt holes 48b into the holes 88b. The units 10, 16, and 18 must be fixed together to prevent the units from tipping over when the equipment module 14 is extended and tipped.

For wall mounting of the cabinet assembly 10, the support shelf 12 is first attached to the wall using the bolt holes 50. Once the support shelf is in place on the wall, the equipment cabinet is placed onto the support shelf and the stop arms 66 connected with screws and nuts to both section 12, 14. Additional cabinet assemblies 10 can be mounted below and/or on top, the cable and wires running conveniently in the wire troughs 67. If multiple cabinet assemblies 10 are wall mounted on top each other, spacers 16 should be used to separate the various cabinets assemblies 10 from one another to provide the necessary clearance for the equipment module 14 to tilt, and to provide adequate ventilation for each equipment module to prevent overheating. The various cabinet assemblies and spacers are bolted to one another as previously described in addition to being bolted to the wall.

The above illustrated example highlights many of the advantages of the present invention. It provides a convenient, efficient modular design that simplifies installation and maintenance of certain electronics and telecommunications equipment whether pedestal or wall mounted.

The equipment module tilts downward to allow for easy accessibility to the equipment rear for wire and cable installation. Troughs are built-in to allow wall mount and to control and protect the wire and cable runs.

The foregoing description is intended to describe the invention by illustration of a preferred embodiment. The illustration is not intended to limit the invention in any way, and is to be limited by the appended claims only.

What is claimed is:

1. An electronics cabinet assembly having a front and a rear, said cabinet assembly comprising:

a support shelf;

an equipment module movably supported on said support shelf, said equipment module being movable between a closed position adjacent the rear of the support shelf, and an extended position substantially forward relative to the support shelf, said equipment module being hingeably supported on said support shelf when said equipment module is in the extended position to form a pivot axis about which a front of said equipment module can tilt downwards; and a stop arm having one end connected to said shelf and another end connected to said module to limit the tilting of said equipment module, said stop arm comprising first and second arms pivotally connected to one another.

2. An electronics cabinet assembly in accordance with claim 1 wherein said support shelf comprises a track attached to said support shelf, said track extending forward from the rear of said support shelf, and said equipment module being movably supported on said track.

3. An electronics cabinet assembly in accordance with claim 2 wherein said track comprises at least two tracks positioned on opposite sides of said support shelf and extending forward from the rear of said support shelf, said tracks having a substantially flat surface to allow sliding movement thereon.

4. An electronics cabinet assembly in accordance with claim 2 wherein said track comprises a brace having a flat surface on which said equipment module is movably supported.

5. An electronics cabinet assembly in accordance with claim 2 wherein said track comprises a rail having a top edge.

6. An electronics cabinet assembly in accordance with claim 1 further comprising a trough between the rear of said equipment module and the rear of said support shelf when the equipment module is in the closed position, and a spacer on which said shelf is mountable, said spacer being lesser in depth than said equipment module and having sufficient height such that a second support shelf and equipment module of similar depth as said first equipment module mounted beneath said spacer will not interfere with the tilting of said first equipment module, said spacer further having a trough positioned to be aligned with said first trough when said shelf is mounted to said spacer.

7. An electronics cabinet assembly in accordance with claim 1 further comprising:

a pair of projections extending upwardly from opposite sides of the front of said support shelf and having an edge; and a pair of pins fixed on opposite sides of said equipment module, each of said pins being positioned to engage said edge of one of said projections when said equipment module is in a fully tilted position to prevent further tilting.

8. An electronics cabinet assembly in accordance with claim 1 further comprising at least one pin fixed to said equipment module and positioned to hingeably engage a forward section of said support shelf and define a pivot axis about which the equipment module is tiltable when said equipment module is in the extended position.

9. An electronics cabinet assembly in accordance with claim 8 wherein said support shelf includes a notch positioned to hingably engage and support said pin when said equipment module is in the extended position.

10. An electronics cabinet assembly in accordance with claim 9 wherein said shelf comprises a support arm forming a side of said shelf comprises a support arm forming a side of said shelf and extending forward from the rear, said track being attached to said support arm, and said notch being formed in said arm.

11. An electronics cabinet assembly having a front and a rear, said cabinet assembly comprising:

a support shelf having a pair of tracks;

an equipment module supported on the support shelf to be moveable on the tracks, said equipment module being moveable between a closed position substantially supported on the tracks and an extended position forward of the closed position and substantially off of the tracks, the equipment module being supported hingeably on the support shelf when the equipment module is in the extended position so that the front of the equipment module is tiltable downward relative to the shelf into a tilted position;

a first trough positioned between the rear of the equipment module and the rear of the support shelf when the equipment module is in the closed position; and a spacer on which said shelf is mountable, said spacer being lesser in depth than said equipment module and having sufficient height such that a second support shelf and equipment module of similar depth as said first equipment module mounted beneath said spacer will not interfere with the tilting of said first equipment module, said spacer further having a trough positioned to be aligned with said first trough when said shelf is mounted to said spacer.

12. An electronics cabinet assembly in accordance with claim 11 wherein said trough is the substantial width of said cabinet assembly.

13. An electronics cabinet assembly in accordance with claim 11 having a pin fixed to said equipment module, said pin being positioned to pivotally engage a forward section of said support shelf and define a pivot axis about which the equipment module is tiltable when the equipment module is in the extended position.

14. An electronics cabinet assembly in accordance with claim 13 wherein said support shelf includes a notch engaged by and supporting said pin when the equipment module is in the extended position.

15. An electronics cabinet assembly in accordance with claim 13 having a second pin fixed to said equipment module and positioned to engage the support shelf when the support shelf is in a fully tilted position to prevent further tilting.

16. An electronics cabinet assembly in accordance with claim 11 further comprising:

a pair of projections extending upwardly from opposite sides of the front of said support shelf and having an edge; and a pair of pins fixed on opposite sides of said equipment module, each of said pins being positioned to engage said edge of one of said projections when said equipment module is in a fully tilted position to prevent further tilting.

17. An electronics cabinet assembly in accordance with claim 11 wherein said tracks include a rail having a flat edge on which said equipment module is movably supported.

18. An electronics cabinet assembly in accordance with claim 11 wherein said tracks include a brace having a flat surface on which said equipment module is movably supported.

* * * * *